US008282400B2

(12) United States Patent
Yang et al.

(10) Patent No.: US 8,282,400 B2
(45) Date of Patent: Oct. 9, 2012

(54) ELECTRONIC CONNECTOR WITH GROUNDING METAL PLATE

(75) Inventors: Ou Yang, Guang-Dong (CN); Ping-Chih Chen, Tu-Cheng (TW); Hong-Tu Zhang, Guang-Dong (CN); Ming-Chiang Chen, Tu-Cheng (TW)

(73) Assignee: Cheng Uei Precision Industry Co., Ltd., Tu-Cheng, Taipei Hsien (TW)

( * ) Notice: Subject to any disclaimer, the term of this patent is extended or adjusted under 35 U.S.C. 154(b) by 178 days.

(21) Appl. No.: 12/946,859

(22) Filed: Nov. 16, 2010

(65) Prior Publication Data

US 2012/0122322 A1 May 17, 2012

(51) Int. Cl.
*H01R 12/00* (2006.01)
*H05K 1/00* (2006.01)

(52) U.S. Cl. ............................... 439/55; 439/79; 439/92

(58) Field of Classification Search .................... 439/55, 439/80, 96, 79, 75, 92
See application file for complete search history.

(56) References Cited

U.S. PATENT DOCUMENTS

| | | | | |
|---|---|---|---|---|
| D620,444 S * | 7/2010 | Liu et al. | ...................... | D13/147 |
| D620,445 S * | 7/2010 | Yang et al. | ................... | D13/147 |
| D635,926 S * | 4/2011 | Yu | ................................ | D13/147 |
| 8,047,877 B1 * | 11/2011 | Liu et al. | ....................... | 439/660 |

* cited by examiner

*Primary Examiner* — Hae Moon Hyeon
(74) *Attorney, Agent, or Firm* — Cheng-Ju Chiang

(57) ABSTRACT

An electronic connector includes an insulating case, a metal plate and a contact module. The insulating case includes a top surface, a bottom surface, a receiving space defined therein, and a plurality of grooves defined at the top surface. The metal plate is retained in the receiving space and attached to the bottom surface of the insulating case. The contact module is retained in the receiving space, which includes an insulating housing, a plurality of contacts and a ground terminal. Each contact includes a first connecting portion extended above the top surface and aligned with the corresponding groove of the insulating case. The ground terminal includes a second connecting portion and a contacting portion. The second connecting portion is extended above the top surface and aligned with the corresponding groove of the insulating case. The contacting portion is connected to the metal plate.

17 Claims, 4 Drawing Sheets

ELECTRONIC CONNECTOR WITH GROUNDING METAL PLATE

BACKGROUND OF THE INVENTION

1. Field of the Invention

The present invention relates to an electronic connector, more specifically, to an electronic connector with a simple structure.

2. The Related Art

Nowadays, with development of the electronic products, the connection between the electronic products and the peripheral devices are frequent. The connection is achieved by an electronic connector. Since, the electronic connector is used frequently. Because the electronic connector is widely used, the quality of the electronic connector requested by customers becomes higher. Furthermore, the production of the electronic connector becomes large-scale nowadays.

a conventional electronic connector includes a metal shell, an insulating housing and a plurality of contacts. The insulating housing defines a plurality of grooves for respectively receiving and fixing the contacts. The metal shell encloses the insulating housing and the contacts for preventing the insulating housing and the contacts from outside influence. The metal shell defines an opening at one end thereof for connecting a mating connector.

Generally, the electronic connector is fixed to a printed circuit board by soldering operation. Therefore, the metal shell can be fastened on the printed circuit board and the contacts can be connected to the printed circuit board. However, the soldering operation is complexly and easy to cause a false weld. Moreover, it is inconvenience to replace a new electronic connector if an old electronic connector is broke. It is easy to break the printed circuit board if the old electronic connector is replaced by the new electronic connector.

The electronic connector is manufactured by successively assembling the contacts, the insulating housing and the metal shell. The manufacturing procedure is unsuitable in mass production. Because the shell is made by a metal material, the cost of the electronic connector is thereof increased. The connection between the metal shell and the insulating housing is infirm to cause the mating connector connecting to the electronic connector incorrectly.

SUMMARY OF THE INVENTION

An object of the present invention is to provide an electronic connector.

According to the invention, the electronic connector is mounted on a printed circuit board. The electronic connector includes an insulating case, a metal plate and a contact module. The insulating case includes a top surface, a bottom surface and a receiving space defined therein. The top surface is positioned to face the printed circuit board.

The metal plate is retained in the receiving space and attached to the bottom surface of the insulating case. The contact module is retained in the receiving space. The contact module includes an insulating housing, a plurality of contacts and a ground terminal. One end of each contact is extended above the top surface of the insulating case to abut against the printed circuit board, and the other end of each contact is extended in the receiving space. One end of the ground terminal is extended above the top surface of the insulating case to abut against the printed circuit board, and the other end of the ground terminal is connected to the metal plate.

Another object of the present invention is to provide an electronic connector having a ground terminal further comprising a second connecting portion and a contact portion.

According to the invention, the electronic connector includes an insulating case, a metal plate and a contact module. The insulating case includes a top surface, a bottom surface, a receiving space defined therein, and a plurality of grooves defined at the top surface. The metal plate is retained in the receiving space and attached to the bottom surface of the insulating case.

The contact module is retained in the receiving space, which includes an insulating housing, a plurality of contacts and a ground terminal. Each contact includes a first connecting portion extended above the top surface and aligned with the corresponding groove of the insulating case. The ground terminal includes a second connecting portion and a contacting portion. The second connecting portion is extended above the top surface and aligned with the corresponding groove of the insulating case. The contacting portion is connected to the metal plate.

Because the first connecting portion of each contact and the second connecting portion of the ground terminal can electronically connect to the printed circuit board. Since, it is unnecessary to solder the electronic connector to the printed circuit board. The metal plate and the contact module can be easy inserted into and fastened to the insulating case.

Therefore, the electronic connector has a simple structure. The fabricating procedure and the cost of the electronic connector can be reduced. It is convenient to repair and replace the electronic connector if the electronic connector is damaged.

BRIEF DESCRIPTION OF THE DRAWINGS

The present invention will be apparent to those skilled in the art by reading the following description of preferred embodiments thereof, with reference to the attached drawings, in which.

DETAILED DESCRIPTION OF THE PREFERRED EMBODIMENT

Figure 1:
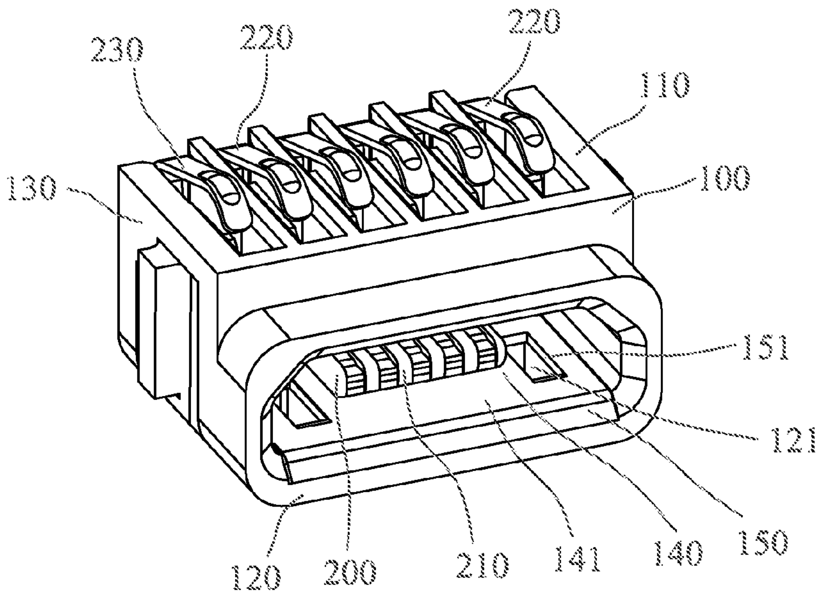
FIG. 1 is a perspective view of an electronic connector saw from a front side according to the present invention.
Figure 2:
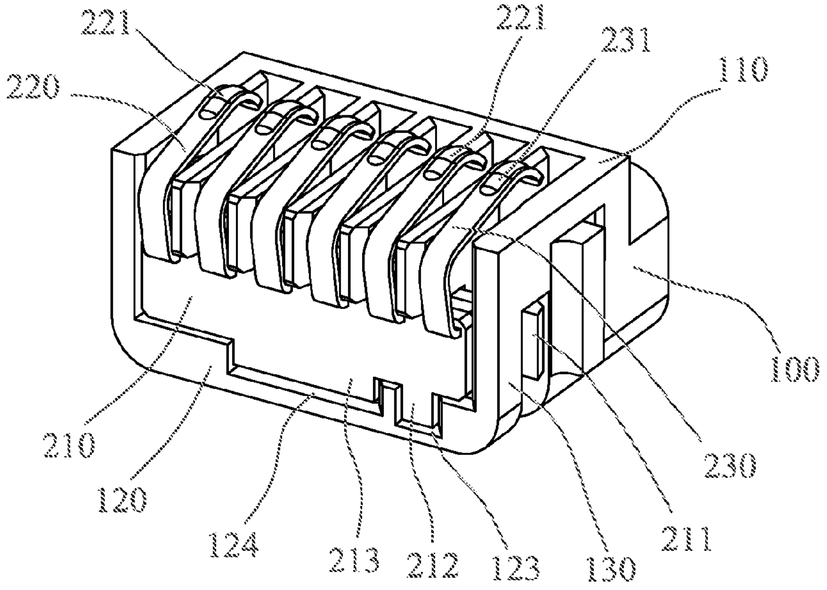
FIG. 2 is a perspective view of the electronic connector saw from a rear side according to the present invention.
Figure 3:
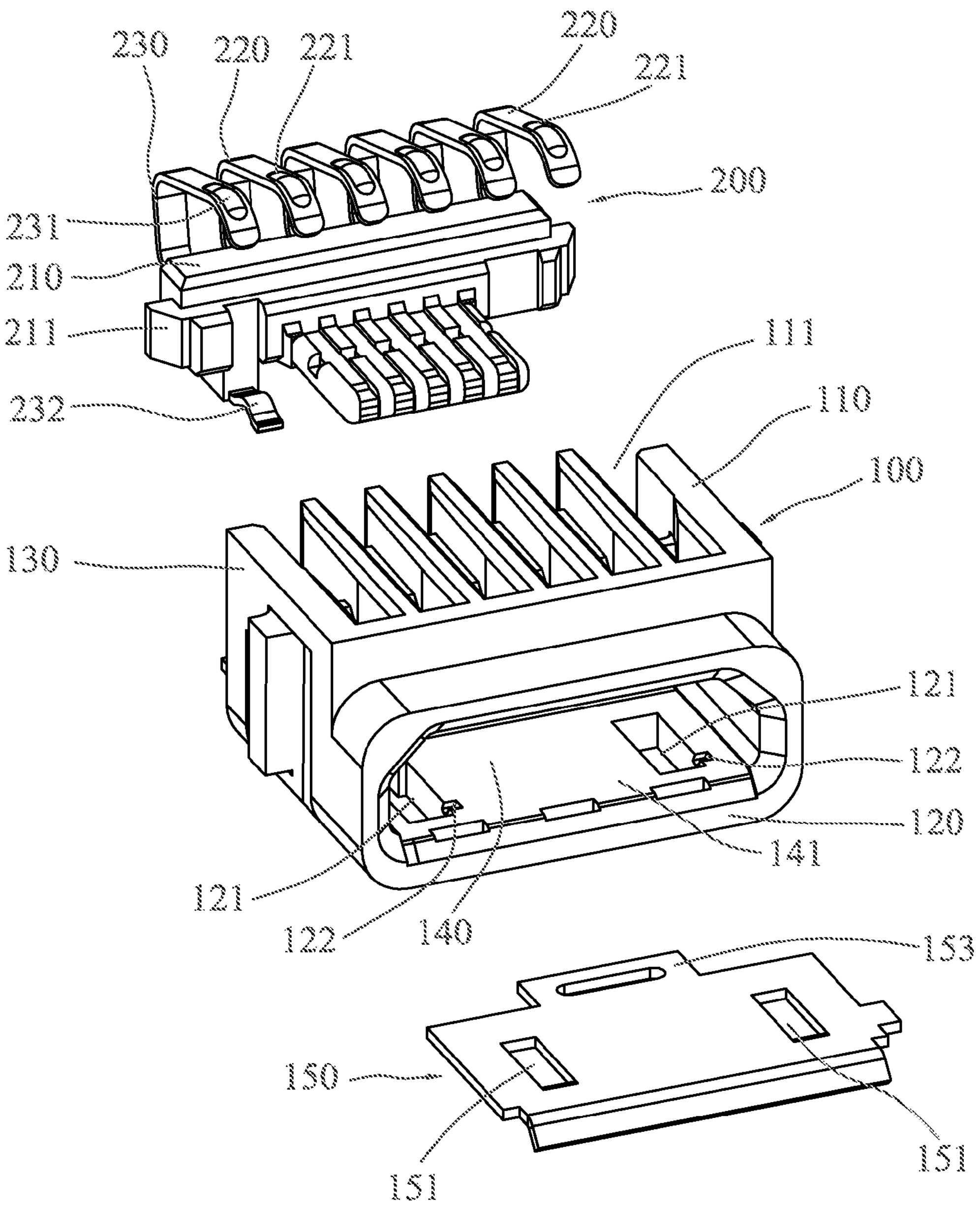
FIG. 3 is an exploded view of the electronic connector in FIG. 1.
Figure 4:
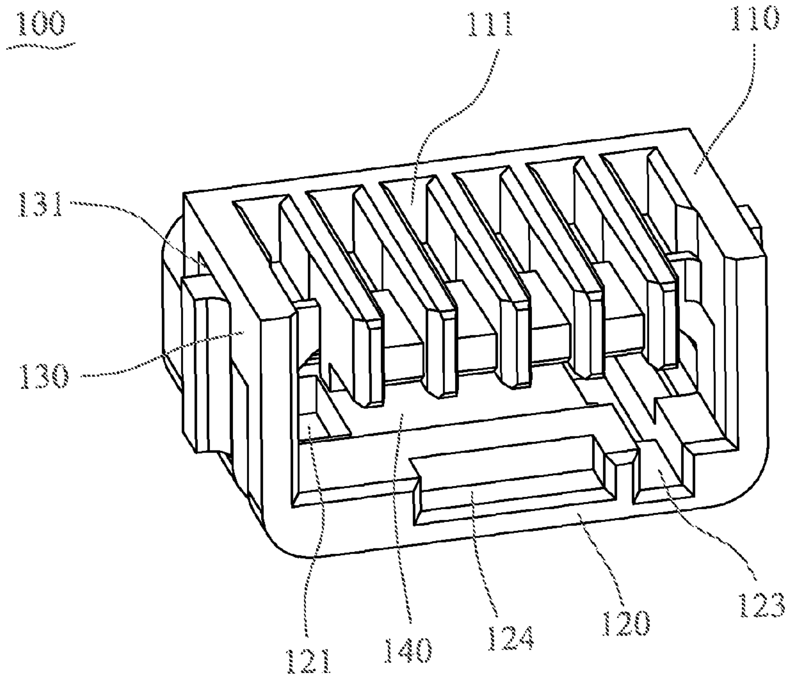
FIG. 4 is a perspective view of an insulating case of the electronic connector in FIG. 1.
Figure 5:
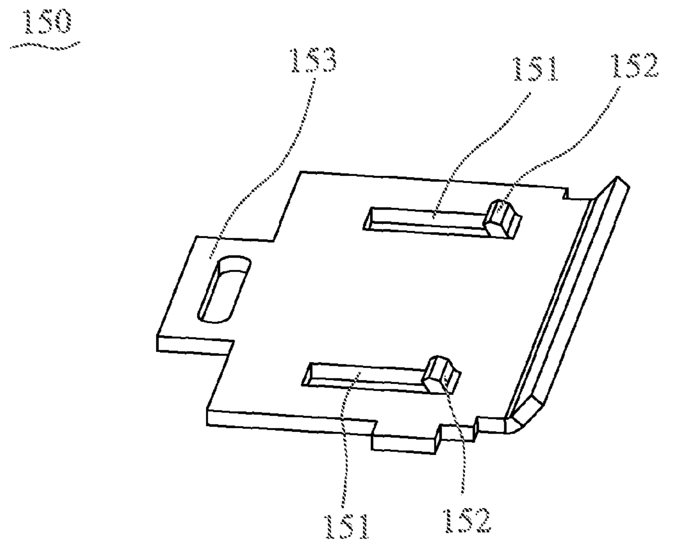
FIG. 5 is a perspective view of a metal plate of the electronic connector in FIG. 1.
Figure 6:
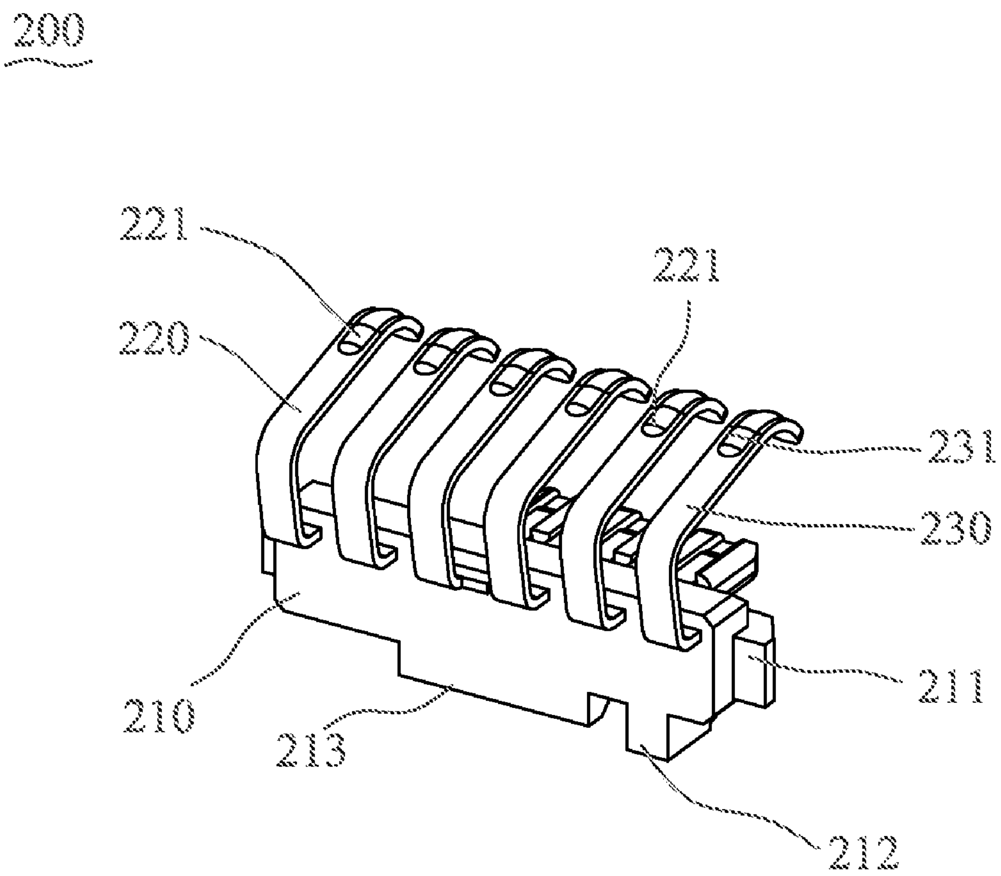
FIG. 6 is a perspective view of a contact module of the electronic connector in FIG. 1.

Please refer to FIG. 1 to FIG. 6. A preferred embodiment of an electronic connector includes an insulating case 100, a metal plate 150 and a contact module 200. The contact module 200 includes an insulating housing 210, a plurality of contacts 220 and a ground terminal 230. The insulating case 100 defines a receiving space 140 for receiving and fastening the contact module 200. The contacts 220 and the ground terminal 230 are respectively fixed to the insulting housing 210. Especially, the contacts 220, the ground terminal 230 and the insulating housing 210 are formed integrally by insert molding.

The insulating housing 210 includes opposite sides and a projection 211 protruded outwardly from each of the sides.

The insulating case 100 includes opposite side surfaces 130 and a through hole 131 defined at each side surface 130. The projection 211 of the insulating housing 210 engages with the through hole 131 of the insulating case 100 for fastening the contact module 200 in the receiving space 140 of the insulating case 100. The metal plate 150 is fastened in the receiving space 140 of the insulating case 100 and connected to the contact module 200.

The insulating case 100 is made of a plastic material and thereof is inexpensive and equipped with great flexibility for preventing the contact module 200 and the metal plate 150 from an outside influence. The insulating case 100 includes a top surface 110, a bottom surface 120 and the side surfaces 130 together surrounding the receiving space 140. A front end of the receiving space 140 is defined as a mating opening 141. The mating opening 141 is connected to the receiving space 140. A mating connector (not shown in figures) can be inserted into the receiving space 140 through the mating opening 141 for connecting to the electronic connector.

The top surface 110 of the insulating case 100 is positioned to face a printed circuit board (not shown in figures). The top surface 100 defines a plurality of penetrating grooves 111 extending from a front end portion to the rear end portion thereof and penetrating the rear end portion thereof. The bottom surface 120 is defined a pair of first channel 121, a notch 122, a first concave 123 and a second concave 124. The notch 122 is defined at one side of each first channel 121. The first concave 123 and the second concave 124 are defined at a rear end portion of the bottom surface 120 and opposite to the mating opening 141.

The metal plate 150 is defined a pair of second channels 151 to align with and connect to the first channels 121. The metal plate 150 includes a tab 152 extending from one side of each second channel 151 for engaging with the notch 122 of the insulating case 100. Since, the metal plate 150 is fixed and attached to bottom surface 120 of the insulating case 100. The metal plate 150 not only can improve the strength of the structure of the insulating case 100 but also can prevent the bottom surface 120 of the insulating case 100 from damage by the mating connector if the mating connector is inserted into the receiving space 140 through the mating opening 141. The metal plate 150 is extended to form an interfering portion 153 from a rear edge thereof.

A first block 212 and a second block 213 are protruded from a bottom surface of the insulating housing 210 of the contact module 200 for respectively engaging with the first concave 123 and the second concave 124 of the insulating case 100. Since, the contact module 200 is firmly retained in the receiving space 140 of the insulating case 100.

The interfering portion 153 of the metal plate 150 abuts against the second block 213 for preventing the metal plate 150 from slipping out the receiving space 140 if the mating connector inserts into the receiving space 140 and pushes the metal plate 150.

One end of each contact 220 and one end of the ground terminal 230 are respectively bent and extended above the top surface 110 of the insulating case 100 to respectively form a first connecting portion 221 and a second connecting portion 231. The first connecting portion 221 of the contact 220 and the second connecting portion 231 of the ground terminal 230 are respectively aligned with the grooves 111 of the insulating case 100. The printed circuit board can be pressed on top surface 110 of the insulating case 100 to connect to the first connecting portion 221 of the contact 220 and the second connecting portion 231 of the ground terminal 230.

The other end of each contact 220 is passed through the insulating housing 210 and extended toward the mating opening 141 for connecting to the mating connector. The other end of the ground terminal 230 is extended and bent toward the receiving space 140 to form a contacting portion 232. The contacting portion 232 of the ground terminal 230 passes the first channel 121 to connect to the metal plate 150. The mating connector may electronically couple to the ground terminal 230 of the contact module 200 through the metal plate 150 if the mating connector is inserted into the receiving space 140 through the mating opening 141. Since, it can prevent the electronic connector and the mating connector from electronic influence.

Because the metal plate 150 is attached to the bottom surface 120 of the insulating case 100, a conductive area between a metal shell of the mating connector and the ground terminal 230 is increased for improving the electronic conduction. If the mating connector is equipped with a mating ground terminal, the mating ground terminal may electronically couple to the ground terminal 230 of the electronic connector through the metal plate 150.

If the electronic connector is fabricated, the metal plate 150 is attached to the bottom surface 130 of the insulating case 100. The second channel 151 of the metal plate 150 is aligned with the first channel 121 of the insulating case 100, and the tab 152 of the metal plate 150 is engaged into the notch 122 of the insulating case 100.

The contact module 200 is inserted into the receiving space 140 from the rear end portion of the insulating case 100. Therefore, the projection 211 of the insulating housing 210 is engaged into the through hole 131 of the insulating case 100, and the first block 212 and the second block 213 are respectively engaged into the first concave 123 and the second concave 124 of the insulating case 100. The contact module 200 is firmly retained in the receiving space 140 of the insulating case 100.

Therefore, the first connecting portion 221 of the contacts 220 and the second connecting portion 231 of the ground terminal 230 are respectively aligned with the grooves 111 and above the top surface 110 of the insulating case 100. The contacting portion 232 of the ground terminal 230 of the contact module 200 is passed the first channel 121 and connected to the metal plate 150.

The insulating case 100 of the electronic connector is positioned on the printed circuit. Therefore, the first connecting portion 221 of each contact 220 and the second connecting portion 231 of the ground terminal 230 are abutted against and electronically connected to the printed circuit board. The mating connector can be inserted into the receiving space 140 through the mating opening 141 to connect to the contact module 200 of the electronic connector. The mating connector can electronically couple to the printed circuit board through the electronic connector.

As described above, the first connecting portion 221 of each contact 220 and the second connecting portion 231 of the ground terminal 230 can electronically connect to the printed circuit board. Since, it is unnecessary to solder the electronic connector to the printed circuit board. The metal plate 150 and the contact module 200 can be easy inserted into and fastened to the insulating case 100.

Therefore, the electronic connector has a simple structure. The fabricating procedure and the cost of the electronic connector can be reduced. It is convenient to repair and replace the electronic connector if the electronic connector is damaged.

Furthermore, the present invention is not limited to the embodiments described above; diverse additions, alterations and the like may be made within the scope of the present invention by a person skilled in the art. For example, respective embodiments may be appropriately combined.

What is claimed is:

1. An electronic connector mounted on a printed circuit board, comprising:

an insulating case comprising a top surface, a bottom surface and a receiving space defined therein, the top surface being positioned to face the printed circuit board;

a metal plate retained in the receiving space and attached to the bottom surface of the insulating case; and a contact module being retained in the receiving space and comprising:

an insulating housing;

a plurality of contacts fixed to the insulating housing, one end of each contact extended above the top surface of the insulating case to abut against the printed circuit board, the other end of each contact extended in the receiving space; and a ground terminal fixed to the insulating housing, one end of the ground terminal extended above the top surface of the insulating case to abut against the printed circuit board, the other end of the ground terminal connected to the metal plate.

2. The electronic connector as claimed in claim 1, further comprising a first channel defined at the bottom surface of the insulating case, the other end of the ground terminal connected to the metal plate through the first channel.

3. The electronic connector as claimed in claim 2, further comprising an interfering portion extended from the metal plate for being fastened to the insulating housing of the contact module.

4. The electronic connector as claimed in claim 3, further comprising a tab extended from the metal plate for being engaged into the first channel of the insulating case.

5. The electronic connector as claimed in claim 4, further comprising a second channel defined at the metal plate for being aligned with and connected to the first channel of the insulating case, the tab extended from one side of the second channel.

6. The electronic connector as claimed in claim 5, further comprising a first concave defined at the bottom surface of the insulating case, and a first block protruded from the insulating housing for being engaged into the first concave.

7. The electronic connector as claimed in claim 6, further comprising a second concave defined at the bottom of the insulating case and separated from the first concave, and a second block protruded from the insulating housing and separated from the first block for being engaged into the second concave.

8. The electronic connector as claimed in claim 7, further comprising at least one through hole defined at the insulating case, and a projection protruded from the insulating housing for being engaged into the through hole.

9. The electronic connector as claimed in claim 8, further comprising a plurality of grooves defined at the top surface of the insulating case to respectively align with one end of each contact and one end of the ground terminal.

10. An electronic connector comprising:

an insulating case comprising a top surface, a bottom surface, a receiving space defined therein, and a plurality of grooves defined at the top surface;

a metal plate retained in the receiving space and attached to the bottom surface of the insulating case; and a contact module being retained in the receiving space and comprising:

an insulating housing;

a plurality of contacts fixed to the insulating housing, each contact comprising a first connecting portion extended above the top surface and aligned with the corresponding groove of the insulating case; and a ground terminal, fixed to the insulating housing, comprising:

a second connecting portion extended above the top surface and aligned with the corresponding groove of the insulating case; and a contacting portion connected to the metal plate.

11. The electronic connector as claimed in claim 10, further comprising a first channel defined at the bottom surface of the insulating case, the contacting portion of the ground terminal connected to the metal plate through the first channel.

12. The electronic connector as claimed in claim 11, further comprising an interfering portion extended from the metal plate for being fastened to the insulating housing of the contact module.

13. The electronic connector as claimed in claim 12, further comprising a tab extended from the metal plate for being engaged into the first channel of the insulating case.

14. The electronic connector as claimed in claim 13, further comprising a second channel defined at the metal plate for being aligned with and connected to the first channel of the insulating case, the tab extended from one side of the second channel.

15. The electronic connector as claimed in claim 14, further comprising a first concave defined at the bottom surface of the insulating case, and a first block protruded from the insulating housing for being engaged into the first concave.

16. The electronic connector as claimed in claim 15, further comprising a second concave defined at the bottom of the insulating case and separated from the first concave, and a second block protruded from the insulating housing and separated from the first block for being engaged into the second concave.

17. The electronic connector as claimed in claim 16, further comprising at least one through hole defined at the insulating case, and a projection protruded from the insulating housing for being engaged into the through hole.

* * * * *